(12) United States Patent
Pillarisetty et al.

(10) Patent No.: US 11,195,578 B2
(45) Date of Patent: Dec. 7, 2021

(54) 1S-1C DRAM WITH A NON-VOLATILE CBRAM ELEMENT

(71) Applicant: Intel Corporation, Santa Clara, CA (US)

(72) Inventors: Ravi Pillarisetty, Portland, OR (US); Abhishek A. Sharma, Hillsboro, OR (US); Brian S. Doyle, Portland, OR (US); Elijah V. Karpov, Portland, OR (US); Prashant Majhi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/636,904

(22) PCT Filed: Sep. 29, 2017

(86) PCT No.: PCT/US2017/054597
§ 371 (c)(1),
(2) Date: Feb. 5, 2020

(87) PCT Pub. No.: WO2019/066964
PCT Pub. Date: Apr. 4, 2019

(65) Prior Publication Data
US 2020/0168274 A1 May 28, 2020

(51) Int. Cl.
*G11C 13/00* (2006.01)
*H01L 27/24* (2006.01)

(52) U.S. Cl.
CPC ........ *G11C 13/0011* (2013.01); *G11C 13/003* (2013.01); *G11C 13/0026* (2013.01);
(Continued)

(58) Field of Classification Search
CPC ............ G11C 13/0011; G11C 13/0026; G11C 13/0028; G11C 13/003; G11C 13/0038;
(Continued)

(56) References Cited

U.S. PATENT DOCUMENTS 7,295,462 B2 * 11/2007 Farnworth ......... G11C 13/0004
365/148
7,848,135 B2 * 12/2010 Elmegreen ......... G11C 13/0002
365/157
(Continued)

FOREIGN PATENT DOCUMENTS

WO    WO-2015-171680    11/2015

OTHER PUBLICATIONS

International Search Report and Written Opinion for International Patent Application No. PCT/US2017/054597 dated Jun. 29, 2018, 12 pgs.
(Continued)

*Primary Examiner* — Vanthu T Nguyen
(74) *Attorney, Agent, or Firm* — Schwabe, Williamson & Wyatt, P.C.

(57) ABSTRACT

One embodiment of a memory device comprises a selector and a storage capacitor in series with the selector. A further embodiment comprises a conductive bridging RAM (CBRAM) in parallel with a storage capacitor coupled between the selector and zero volts. A plurality of memory devices form a 1S-1C or a 1S-1C-CBRAM cross-point DRAM array with $4F^2$ or less density.

16 Claims, 8 Drawing Sheets

(52) U.S. Cl.
CPC ...... *G11C 13/0028* (2013.01); *G11C 13/0038* (2013.01); *G11C 13/0069* (2013.01); *H01L 27/2409* (2013.01); *G11C 2213/32* (2013.01); *G11C 2213/76* (2013.01)

(58) Field of Classification Search
CPC ............ G11C 13/0069; G11C 2213/32; G11C 2213/76; H01L 27/2409
See application file for complete search history.

(56) References Cited

U.S. PATENT DOCUMENTS

| | | | |
|---|---|---|---|
| 7,933,139 B2* | 4/2011 | Lung | G11C 13/0069 |
| | | | 365/148 |
| 8,891,323 B2* | 11/2014 | Ahn | G11C 11/21 |
| | | | 365/201 |
| 9,251,884 B2* | 2/2016 | Elmegreen | G11C 11/221 |
| 9,672,917 B1 | 6/2017 | Costa et al. | |
| 2012/0127779 A1 | 5/2012 | Scheuerlein et al. | |
| 2015/0340406 A1 | 11/2015 | Jo | |
| 2016/0012886 A1 | 1/2016 | Nazarian et al. | |

OTHER PUBLICATIONS

International Preliminary Report on Patentability for International Patent Application No. PCT/US2017/054597 dated Apr. 9, 2020, 8 pgs.

* cited by examiner

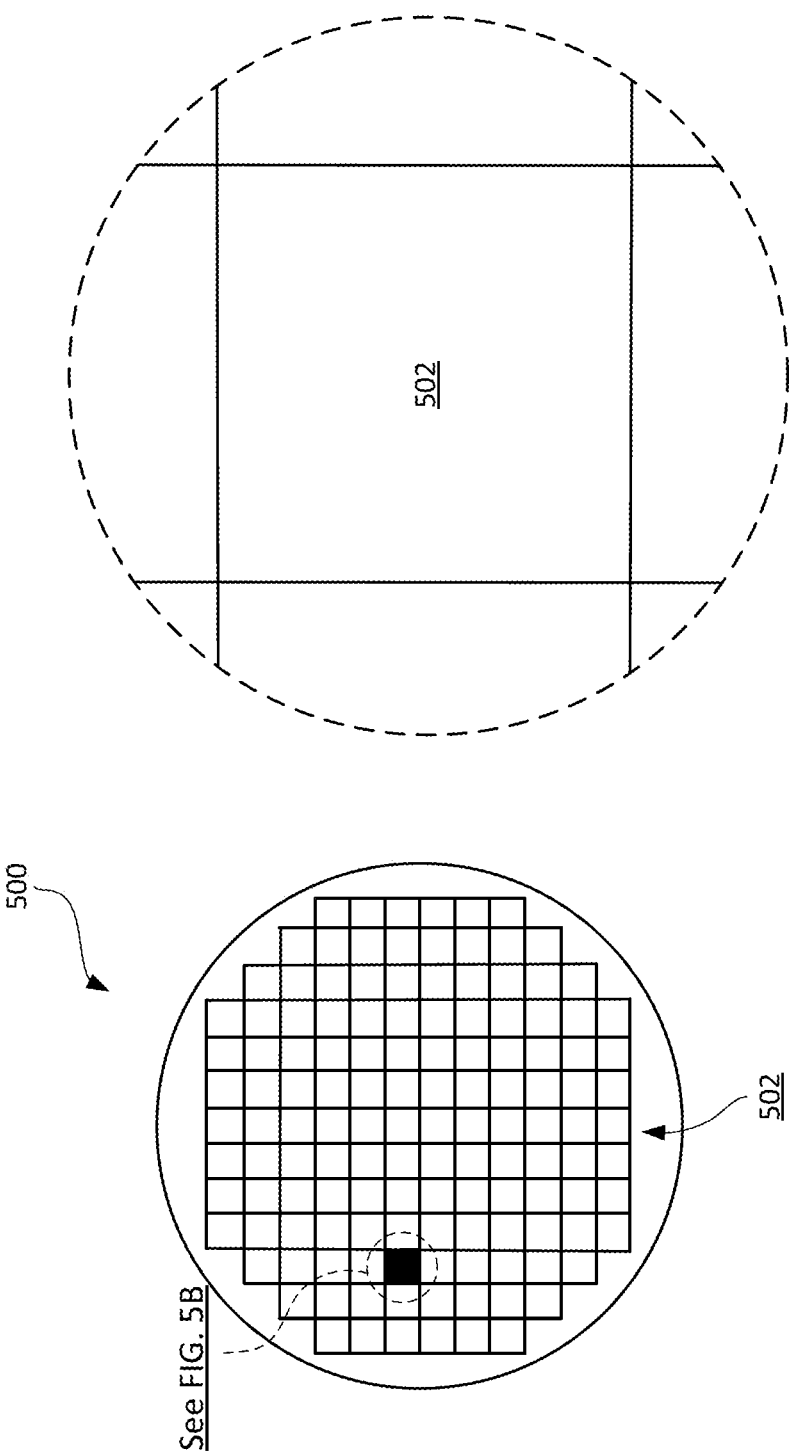

1S-1C DRAM WITH A NON-VOLATILE CBRAM ELEMENT

CROSS-REFERENCE TO RELATED APPLICATION

This patent application is a U.S. National Phase Application under 35 U.S.C. § 371 of International Application No. PCT/US2017/054597, filed Sep. 29, 2017, entitled "1S-1C DRAM WITH A NON-VOLATILE CBRAM ELEMENT," which designates the United States of America, the entire disclosure of which is hereby incorporated by reference in its entirety and for all purposes.

TECHNICAL FIELD

Embodiments of the disclosure are in the field of integrated circuit structures and, in particular, a 1S-1C DRAM with anon-volatile CBRAM element.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend density through such processes. Consequently, fabrication of the functional components needed for future technology nodes may require the introduction of new methodologies or the integration of new technologies in current fabrication processes or in place of current fabrication processes.

Thus, significant improvements are still needed in the area of memory device manufacture and operation.

BRIEF DESCRIPTION OF THE DRAWINGS

FIGS. 5A and 5B are top views of a wafer and dies that include one or more 1S-1C-CBRAM cross-point DRAM arrays, in accordance with one or more of the embodiments disclosed herein.

DESCRIPTION OF THE EMBODIMENTS

Figure 1A:
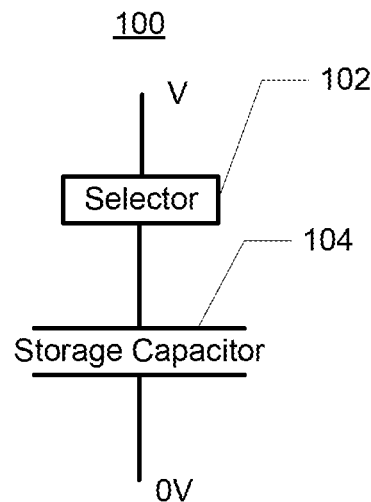
FIG. 1A illustrates a schematic representation of a hypothetical 1S-1C cell in accordance with the disclosed embodiment.

A 1S-1C DRAM with a non-volatile CBRAM element is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, one or more embodiments are directed to structures and architectures for a one selector (1S)/one capacitor (1C) DRAM with a non-volatile CBRAM element. Such embodiments may have applications for one or more of cross-point memory, embedded memory, memory, and memory arrays.

To provide context, a state-of-the-art one transistor (1T)/one capacitor (1C) DRAM array includes cells having an access transistor in the front end. Peripheral circuitry for the 1T-1C DRAM array is also included in the front end. The cells further include a capacitor over a bit line (COB) higher in the stack in the silicon back end. The access transistor occupies valuable silicon real estate of the wafer. Consequently, the cells are relatively large in size. For example, a 1T-1C DRAM cell may have an area $8F^2$ (F: min. feat. size).

Methods for providing a denser 1C DRAM array are limited. One embodiment replaces the three terminal transistor with a two terminal selector. For example, NRAM and RRAM memories use a selector with a resistive memory to form a 1T-1R cell, which operates by changing resistance across a dielectric solid-state material. According to one embodiment, the access transistor in the 1T-1C cell is replaced with a selector to create a one selector (1S)/one capacitor (1C) cell or memory element, as shown in FIGS. 1A and 1B.

Figure 1B:
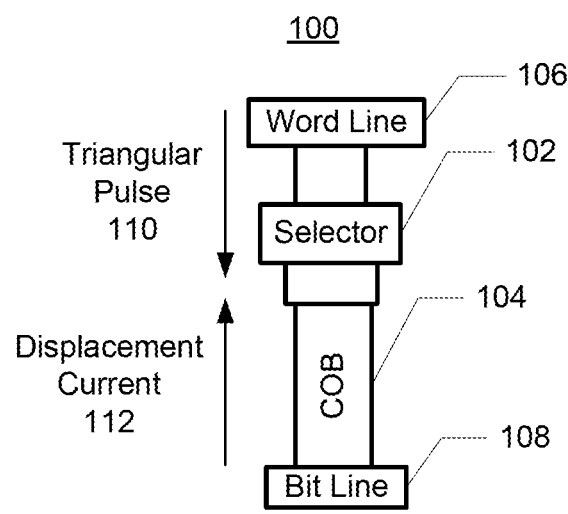
FIG. 1B illustrates a cross-section of the hypothetical 1S-1C.

FIG. 1A illustrates an electrical diagram of 1S-1C cell in accordance with the disclosed embodiment, and FIG. 1B illustrates a cross-section of the 1S-1C cell. As shown in FIG. 1A, the 1S-1C cell 100 includes a selector 102 coupled to a voltage (V) in series with a storage capacitor 104 connected to zero volts. As shown in FIG. 1B, the selector 102 may be coupled to a word line 106, while the storage capacitor 108 may be coupled to a bit line 108 (capacitor over a bit line (COB)).

One problem with creating such a hypothetical 1S-1C cell is that commercially available selector materials require a sufficient current flow through the selector 102 once triggered. For example, a conventional selector 102 may not become conductive unless a minimum of approximately 100 µA of current flows through the selector 102. The problem with attempting to create the 1S-1C 100 cell having the selector 102 in series with the capacitor 104 is that the capacitor 104 has a fairly high impedance or resistance so that the minimum amount of current flowing through the selector 102 will not be achieved. The result is that the selector will fail to "turn on" and there won't be a sufficient voltage drop cross capacitor 104 to be able to read or write the corresponding bit.

In accordance with an embodiment of the present disclosure, a transistor-less array, e.g. with $4F^2$ or less density, is fabricated using the back end of line (BEOL) processes and materials. In one aspect of the disclosure, a transistor-less array is provided comprising memory elements that include only one selector (1S) and one capacitor (1C) in series with the selector. In a second aspect of the disclosure a transistor-less array is provided comprising memory elements that include one selector (1S), one capacitor (1C), and a non-volatile conductive bridging RAM (CBRAM) in parallel with the capacitor.

According to the first aspect of the disclosure, a memory element is provided comprising one selector (1S) and one capacitor (1C) to provide a dense selector based DRAM. In a further embodiment, a cross-point array may be implemented with a 1S-1C memory element located at cross-section of each bit line and word line.

The present embodiment overcomes the high impedance of the capacitor 104 by applying a triangular pulse across the selector 102 and the capacitor 104. As described above, memory element 100 is coupled between wordline 106 and bitline 108, where the selector 102 is coupled to word line 106 upon which a voltage (V) may be applied. The storage capacitor 104, which is in series with the selector 102, is connected to zero volts via bit line 108.

According to the first aspect, a triangular pulse 110 is applied on the word line 106 that has a fast rise time and a short duration, which is sufficient to cause a displacement current 112 through the capacitor 104. The displacement current 112, in turn, applies a voltage across the selector 102 sufficient to turn on the selector 102. Initially, the selector 102 is off and the storage capacitor 104 is uncharged. Applying a triangular pulse from wordline 106 to selector 102 provides a path between the wordline 106 and the bitline 108 that activates the selector 102, as described above. Once the selector 102 is turned on, a steady-state current flows across the selector 102, and the current from the selector 102 is stored as a charge in the storage capacitor 104. As appreciated by those with ordinary skill in the art, a triangular pulse is a signal with a triangular wave form, which means it has a fast ramp up and a ramp down.

In one embodiment, example voltages for the triangular pulse 110 may range from approximately −0.1V to 2V. In one embodiment, example durations for the triangular pulse 110 may range from approximately 200 ps to about 500 ns. In one embodiment, example capacitor values may range from 1E-15 farads to 13E-15 farads. In an embodiment, the preferred conditions for the selector 102 is that the off state leakage should be very low, e.g., approximately 10 picoamps at 100 C.

According to the second aspect of the disclosure, a memory element is provided comprising one selector (1S), one capacitor (1C), and a non-volatile conductive bridging RAM (CBRAM) element to provide a dense selector based DRAM. A CBRAM is a non-volatile memory and may be referred to as a programmable metallization cell (PMC). In the present embodiment, the CBRAM is used as a non-volatile version of a selector. In a further embodiment, a cross-point array may be implemented with the 1S-1C and CBRAM memory element (also referred to herein as a 1S-1C-CBRAM memory element) located at a cross-section of each bit line and word line.

Figure 2A:
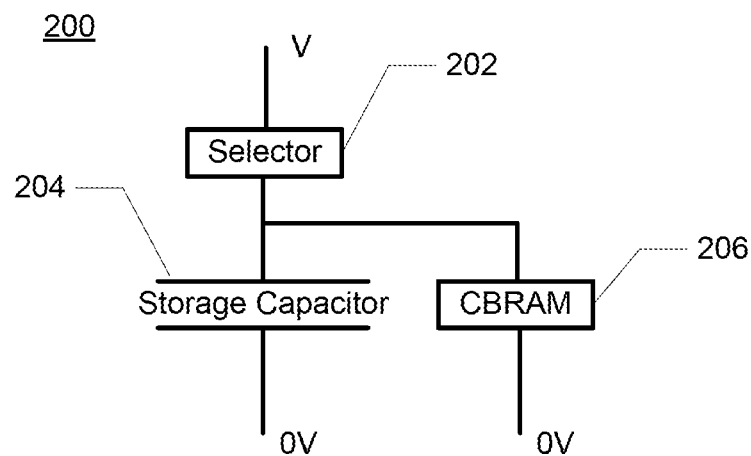
FIG. 2A illustrates a schematic representation of a 1S-1C with CBRAM memory element.
Figure 2B:
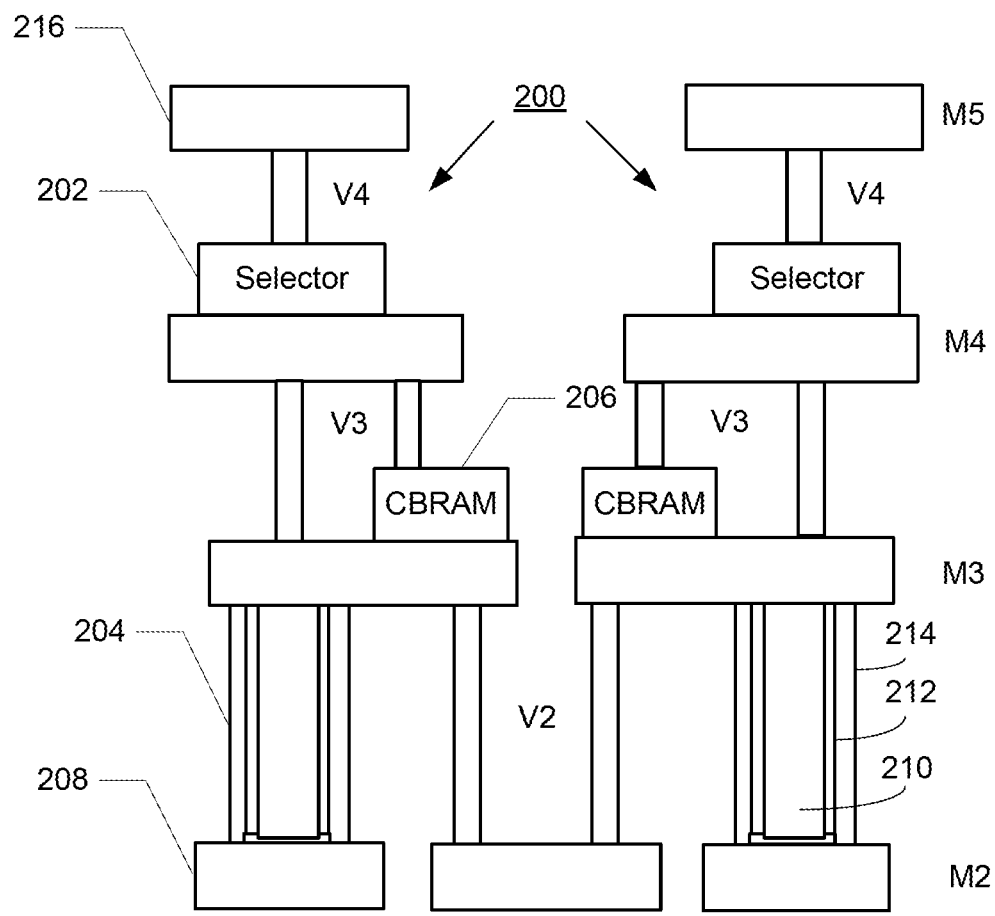
FIG. 2B illustrates an example of a pair of 1S-1C with CBRAM memory elements.

FIG. 2A illustrates a schematic representation of a 1S-1C with CBRAM memory element, and FIG. 2B illustrates an example of a pair of 1S-1C with CBRAM memory elements.

In one embodiment shown in FIG. 2A, the memory device 200 may include an access selector 202 and a storage capacitor 204 in series with the access selector 202. A CBRAM element 206 in parallel with the storage capacitor 204 is coupled between the access selector 202 and zero volts. Both the storage capacitor 204 and the CBRAM 206 have a path to zero volts.

In one embodiment, access selector 202 is a multilayer stack comprising metal/oxide/metal or metal/chalcogenide/metal. In one embodiment, the multilayer stack may comprise metal materials such as TiN, TaN, W, Ti, Ta, Co, and the like, and metal oxide materials such as NbO2, NiO, Ta2O5, TiO2, ZnO, Ga2O3, AL2O3, TaAlOx, HfO2, HfTaOx, HfSiOx, and other composites of these metal oxides.

In the embodiment of FIG. 2B, a pair of memory devices 200 are shown, each having an access selector 202, a storage capacitor 204 in series with the access selector 202, and a CBRAM element 206 in parallel with the storage capacitor 204. The memory devices 200 are arranged in a row between a conductive line 216 and a conductive line 208. The storage capacitor 204 and the CBRAM 206 are coupled to the conductive line 208. In this particular example, the bit line 208 along and the capacitor 204 are on layer M2. The CBRAM 206 is on layer M3, the selector is on layer M4, and the conductive line 216, is on layer M5. Vias such as V2, V3 and V4 may be used to connect the selector 202 and the CBRAM 206 to components on other layers. In one embodiment, the conductive line 208 is a bit line and the conductive line 216 is a word line.

In one embodiment, the storage capacitor 204 may be implemented as a series of concentric cylinders. From smallest to largest, the concentric cylinders may include an inner cylinder comprising a metal internal node 210, a middle cylinder comprising a dielectric layer 212, and an outer cylinder comprising a metal layer 214. In one embodiment, the access selector 202 and the CBRAM 206 are connected via the internal node 210 of the storage capacitor 204.

According to the embodiments disclosed herein, the access selector 202 of each storage capacitor 204 is provided with a parallel path back to zero volts through the CBRAM 206. When the access selector 202 is triggered to turn on, the CBRAM 206 also turns on, which provides the access selector 202 with a very low resistance such that a sufficiently large current flows through both the access selector 202 and the CBRAM 206.

In one embodiment, CBRAM 206 is a multilayer stack comprising metal/oxide/metal or metal/chalcogenide/metal that can primarily switch between a high resistance state and a low resistance state depending on which polarity is applied. The top metal is an active material layer that can ionize to create an ionic bridge through the middle oxide/chalcogenide layer to the bottom metal layer to connect the top and bottom metal layers. A positive bias on the active metal layer creates the ionic bridge, and a positive bias on the other metal layer removes the ionic bridge.

Examples materials for the active metal layer may include tantalum and other metals that are highly stable/inert, such as platinum or indium. The other metal layer is typically not active and may comprise materials such as titanium nitride, platinum nitride, carbon, iridium, and the like. In one embodiment, the middle layer may comprise oxides such as tantalum oxide, silicon dioxide, hafnium, titanium oxide, and composites, zirconium oxide, indium oxide, gallium oxide, zinc oxide and the like. In one embodiment, the middle layer may also comprise chalcogenide family of materials. In another embodiment, the middle layer may also comprise single elements, such as silicon, germanium, arsenic, delirium, antimony (SB), and the like, and combinations thereof.

As further examples, the CBRAM 206 may use non-oxides, i.e., chalcogenides, are GeSex, GeS2, GeTe, Cu2S, Ag2S, and so on. The oxide-based materials may be Ta2O5, SiO2, ZrO2, GeOx, and so on. Other materials include amorphous Si and Si3N4. In some embodiments the CBRAM may use bilayer switching materials: one layer used as a buffer or interfacial layer and the other used as a switching layer. Bilayers materials may include Cu—Te/GdOx, Cu—Te/SiOx, MoOx/GdOx, TiOx/TaSiOy, GeSex/TaOx, Ti/TaOx, Cu—Te/Al2O3, TiW/Al2O3, and CuTe—C/Al2O3.

Figure 3:
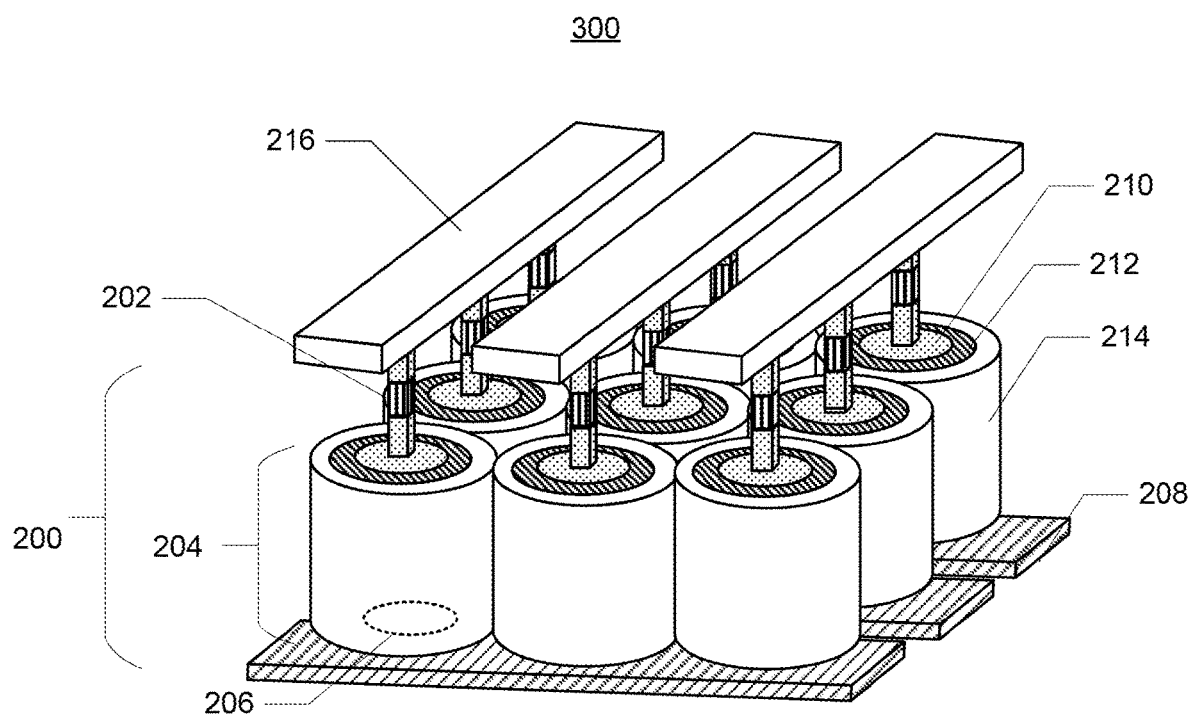
FIG. 3 illustrates an angled three-dimensional view of 1S-1C-CBRAM cross-point DRAM array.

FIG. 3 illustrates an angled three-dimensional view of a 1S-1C-CBRAM cross-point DRAM array. More specifically, the disclosed embodiments provide a backend 1S-1C-CBRAM cross-point DRAM array 300 comprising a plurality of 1S-1C-CBRAM memory elements 200.

Referring to FIG. 3, the 1S-1C cross-point array 300 includes a first plurality of conductive lines 216 along a first direction on a substrate. In an embodiment, the first plurality of conductive lines 216 is a plurality of word lines. A second plurality of conductive lines 208 is along a second direction on the substrate orthogonal to the first direction. In an embodiment, the second plurality of conductive lines 208 is a plurality of bit lines. Individual 1S-1C-CBRAM memory elements 200 are located at cross-sections of the first plurality of conductive lines 216 and the second plurality of conductive lines 208. Individual ones of the plurality of 1S-1C-CBRAM memory elements 200 comprise the access selector 202 and the storage capacitor 204 in series with the access selector 202. The memory elements 200 further include a CBRAM 206 in parallel with the storage capacitor 204 coupled between the access selector 202 and zero volts. In one embodiment, the CBRAM 206 is implemented as part of the capacitor 204, as explained further below, and both are coupled to conductive line 208. In one embodiment, the plurality of storage capacitors 204 in the cross-point DRAM array 300 are all connected together through their respective outer cylinder metal layers 214 and tied to zero volts at an edge of the cross-point DRAM array 300.

In one embodiment, the selector element 104 has a thickness between 20 nanometers –60 nanometers, while the storage capacitor may have a size that ranges from 50×50 nm to 250×250 nm.

Operation of each of the memory elements 200 is as follows. The CBRAM 206 is in a high resistance state (HST) when the CBRAM 206 is off, and a current flowing from conductive line 216 through the selector 202 will not flow through the CBRAM 206 and no charge can be stored in the capacitor 204. The CBRAM 206 is in a low resistance state (LRS) when the CBRAM 206 is on, and a current flowing from conductive line 216 through the selector 202 will flow through the CBRAM 206. The current will also be stored by the capacitor 204 at a value determined by the voltage between the selector 202 and the CBRAM 206. The CBRAM 206 may be toggled on-and-off state by applying a positive and negative bias/voltage, respectively, to the CBRAM 206. The bias/voltage may be applied to the CBRAM 206 from a metal layer, such as M4 in the example shown in FIG. 2A.

A "0" state is written to each memory device 200 by applying Vcc on a first conductive line 216 (e.g., the word line) to turn on both the access selector 202 and the CBRAM 206, and turning off Vcc (and consequently both selector 202 and CBRAM 206) to store 0V in the storage capacitor 204. When the CBRAM 206 is turned off, the CBRAM returns to the low resistance state.

The selector 202 and 206 is symmetric and operates in both positive and negative polarity with the same IV curve. A "1" state is written to each memory element 200 in a similar manner, i.e., with the CBRAM 206 starting in the low resistance state, by applying –Vcc on the first conductive line 216 (e.g., the word line) to turn on the access selector 202 and once the CBRAM 206 resets and –V/2 is stored in the storage capacitor 204.

To read a "0" state, the CBRAM 206 starts in the low resistance state and the storage capacitor stores 0V. A "0" state is read if the access selector 202 does not turn on when V/2 is applied on the second conductive line 208 (e.g., the bit line). To read a "1" state, the CBRAM 206 starts in the high resistance state and the storage capacitor 204 stores −V/2. A "0" state is read if the access selector 202 turns on when V/2 is applied on the second conductive line 208 (e.g., the bit line).

In order to read a 1, or a 0, a voltage equal to Vt is applied on the second conductive line 208 (e.g., the bit line). If the storage capacitor 204 has a voltage across it, the effective voltage across the access selector 202 will be less than Vt (because the voltages will be Vt on storage capacitor 204; Vt/2 on the intermediate node between access selector 202 and storage capacitor 204/CBRAM 206□ Vt/2 on access selector 202). If there is no charge on the storage capacitor 204, the access selector 202 will have a total of Vt, and hence will turn on. The current is sensed through typical current sense amplifiers (CSA) that detects whether or not the selector is on. In one embodiment, the voltage ranges on the BL will be anything within the bounds of −3 to 3 V.

As an example of a general processing scheme, FIGS. 4A-4F illustrate cross-sectional views of various stages in a method of fabricating a 1S-1C-CBRAM cross-point array, in accordance with an embodiment of the present disclosure.

Figure 4A:
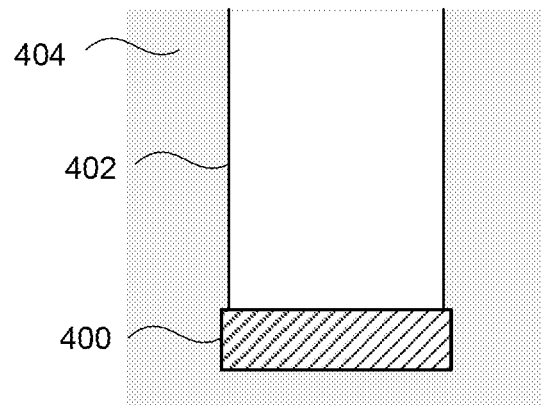
FIGS. 4A-4F illustrate cross-sectional views of various stages in a method of fabricating a 1S-1C-CBRAM cross-point DRAM array, in accordance with an embodiment of the present disclosure.

Referring to FIG. 4A, a method of fabricating memory elements of the cross-point 1S-1C-CBRAM memory array begins with defining storage capacitor locations by forming trenches 402 in an inter-level dielectrics (ILD) layer 404, e.g., silicon dioxide, over a first set of conductive lines 400 (e.g., on M2, but may be any metal level).

Figure 4B:
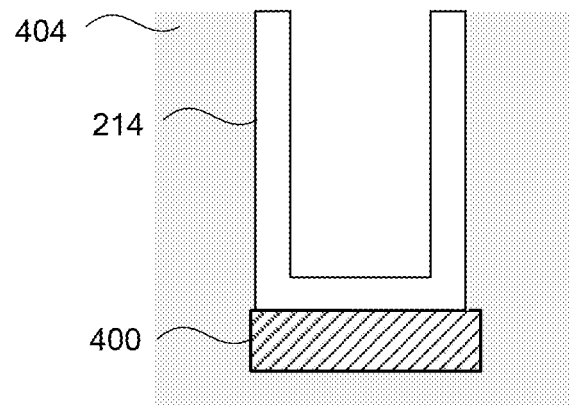
Figure 4C:
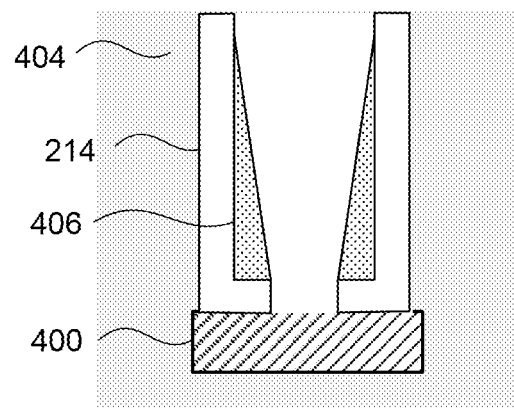

Referring to FIG. 4B, respective outer cylinders comprising the metal layer 214 are formed in the trenches 404 conformal to the sidewalls of the trenches 402 and the tops of the conductive lines 400. Referring to FIG. 4C, a spacer 406 is deposited in each of the trenches 402 and a unidirectional etch is performed on the outer cylinder metal layers 214 to create openings in the metal layers 214 that expose the conductive lines 400. The spacers 406 are then removed.

Figure 4D:
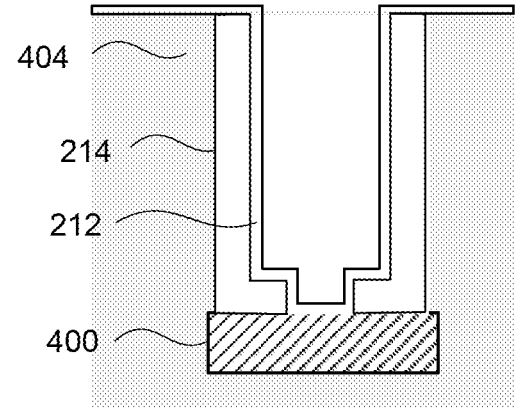
Figure 4E:
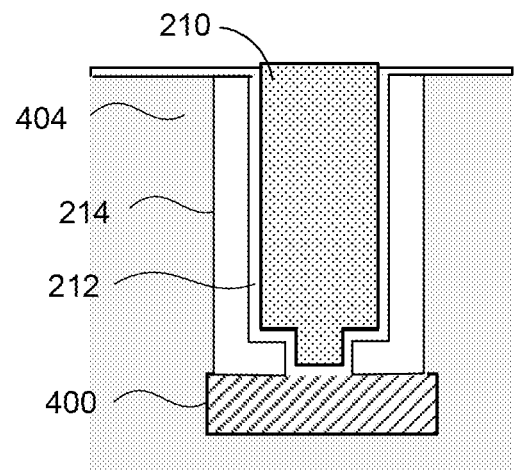

Referring to FIG. 4D, respective middle cylinder comprising the dielectric layers 212 are formed in the trenches conformal to walls of the outer cylinder metal layers 214 and across the tops of the ILD 404. In one embodiment, the dielectric layer 212 comprises a high-k, which is a material with a high dielectric constant k compared to silicon dioxide. Referring to FIG. 4E, respective inner cylinders comprising the metal internal node 210 are formed to fill the remaining area of the trenches, completing the storage capacitor 204.

In accordance with a further aspect of the disclosure, the dielectric layer 212 is used for both the middle dielectric layer of the capacitor 204 as well as the middle dielectric layer of the CBRAM 206. The metal internal node 210 forms a top metal layer of the CBRAM 206, and the conductive line 400 forms the bottom metal layer of the CBRAM 206. In this arrangement, both the capacitor 204 and the CBRAM 206 are connected to the conductive line 400, creating a shared node. More particularly, the outer metal layer 214 of the capacitor 204 is coupled between the conductive line 400 and M3 (assuming the conductive line 400 is at M2), and the dielectric layer 212 of the CBRAM 206 is in contact the conductive line 400 (but not the center of the capacitor 204,) which places the CBRAM 206 in parallel with the storage capacitor 204.

Figure 4F:
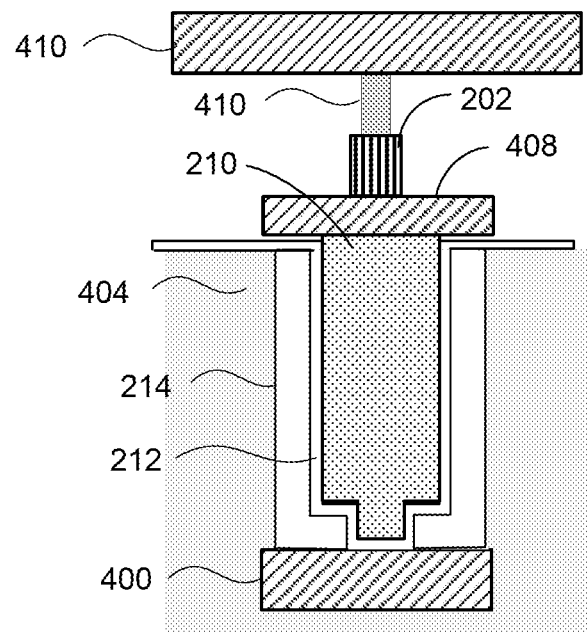

Referring to FIG. 4F, metal layer 408 (e.g., M4) is formed over the storage capacitors 204 followed by forming an access selector 202 and a via 410 over the metal layer. A second set of metal conductive lines 410 (e.g., word lines) are then formed (e.g., M5) on the vias 410. As shown, each of the selectors 202 is coupled to a respective the via 410 and both the selectors 202 and the vias 410 are coupled between the metal layers 408 and the second set of conductive lines 410.

In a first example of suitable selector materials, in an embodiment, the access selector 202 includes a ferroelectric oxide material. In an embodiment, the ferroelectric oxide material is selected from the perovskite group of generic composition $ABO_3$. In an embodiment, the ferroelectric oxide material 112 is selected from the group consisting of lead zirconate titanate (PZT), strontium bismuth tantalum oxide (SBT), and lanthanum-doped lead zirconium titanate (PLZT). In another embodiment, the ferroelectric oxide material 112 includes hafnium and oxygen, such as in the form of hafnium oxide or a metal-doped hafnium oxide. In an embodiment, the ferroelectric oxide material 112 switches polarization states based on a ferroelectric response to changing electric field. In another embodiment, the ferroelectric oxide material switches polarization states based on an anti-ferroelectric response to changing electric field.

In a second example of suitable selector materials, in an embodiment, the access selector 202 includes an insulator metal transition material layer.

In a third example of suitable selector materials, in an embodiment, the access selector 202 includes chalcogenides materials.

In a fourth example of suitable selector materials, in an embodiment, the access selector 202 includes a semiconducting oxide material. In an embodiment, the semiconducting oxide material layer is one such as, but not limited to, indium gallium zirconium oxide (IGZO), tin oxide, antimony oxide, indium oxide, indium tin oxide, titanium oxide, zinc oxide, indium zinc oxide, gallium oxide, titanium oxynitride, ruthenium oxide, or tungsten oxide. In one embodiment, an IGZO layer is used and has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO.

In an embodiment, the conductive lines 208 and 216, such as bit lines and word lines described above, are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Conductive lines, such as bit lines and word lines described above, may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, examples of suitable dielectric materials include, but are not limited to, oxides of silicon (e.g., silicon dioxide (SiO2)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, lithographic operations may be performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that the layers and materials described in association with embodiments herein are typically formed on or above an underlying semiconductor substrate. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated as or on underlying lower level back end of line (BEOL) interconnect layers.

The integrated circuit structures described herein may be included in an electronic device. As an example of one such apparatus, FIGS. 5A and 5B are top views of a wafer and dies that include one or more 1S-1C-CBRAM cross-point DRAM arrays, in accordance with one or more of the embodiments disclosed herein.

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more 1S-1C-CBRAM cross-point DRAM arrays, such as described above. After the fabrication of the semiconductor product is complete, the wafer 500 may undergo a singulation process in which each of the dies 502 is separated from one another to provide discrete "chips" of the semiconductor product. In particular, structures that include embedded non-volatile memory structures having an independently scaled selector as disclosed herein may take the form of the wafer 500 (e.g., not singulated) or the form of the die 502 (e.g., singulated). The die 502 may include one or more 1S-1C a cross-point DRAM arrays and/or supporting circuitry to route electrical signals, as well as any other IC components. In some embodiments, the wafer 500 or the die 502 may include an additional memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
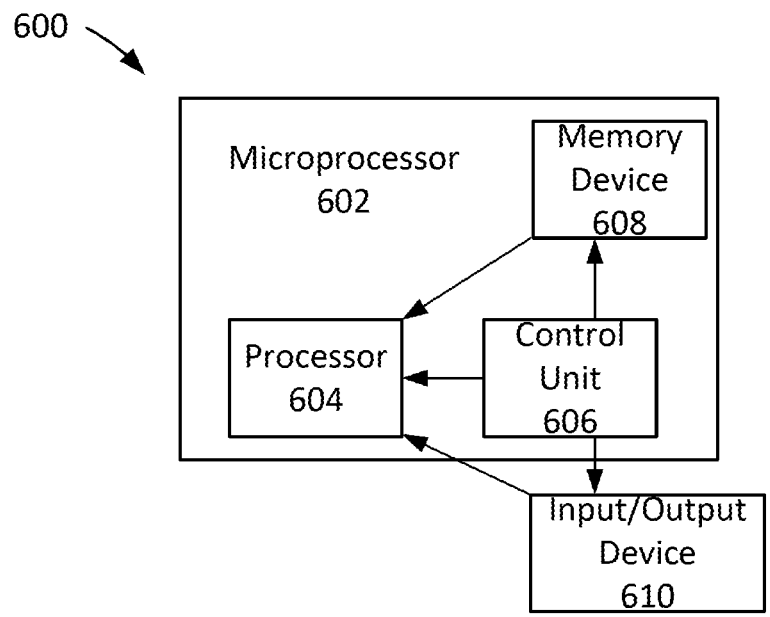
FIG. 6 illustrates a block diagram of an electronic system, in accordance with an embodiment of the present disclosure.

FIG. 6 illustrates a block diagram of an electronic system 600, in accordance with an embodiment of the present disclosure. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be appreciated that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include a non-volatile memory cell as described in the present description. In an embodiment, the memory device 608 is embedded in the microprocessor 602, as depicted in FIG. 6. In an embodiment, the processor 604, or another component of electronic system 600, includes one or more 1S-1C a cross-point DRAM arrays such as those described herein.

Figure 7:
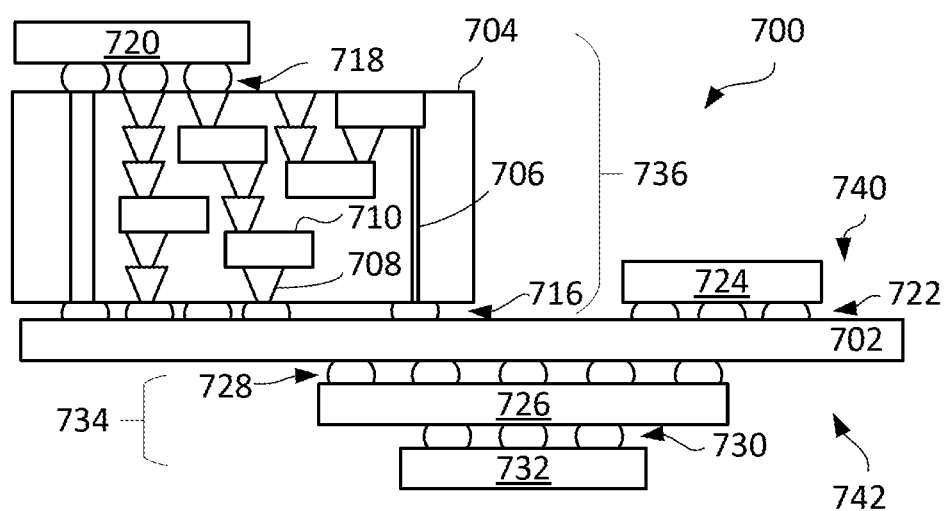
FIG. 7 is a cross-sectional side view of an integrated circuit (IC) device assembly that may include one or more 1S-1C or 1S-1C-CBRAM memory elements, in accordance with one or more of the embodiments disclosed herein.

FIG. 7 is a cross-sectional side view of an integrated circuit (IC) device assembly that may include one or more 1S-1C or 1S-1C-CBRAM memory elements, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of 1S-1C or 1S-1C-CBRAM memory elements, such as disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 702 of FIG. 7B), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 710 and vias 708, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Figure 8:
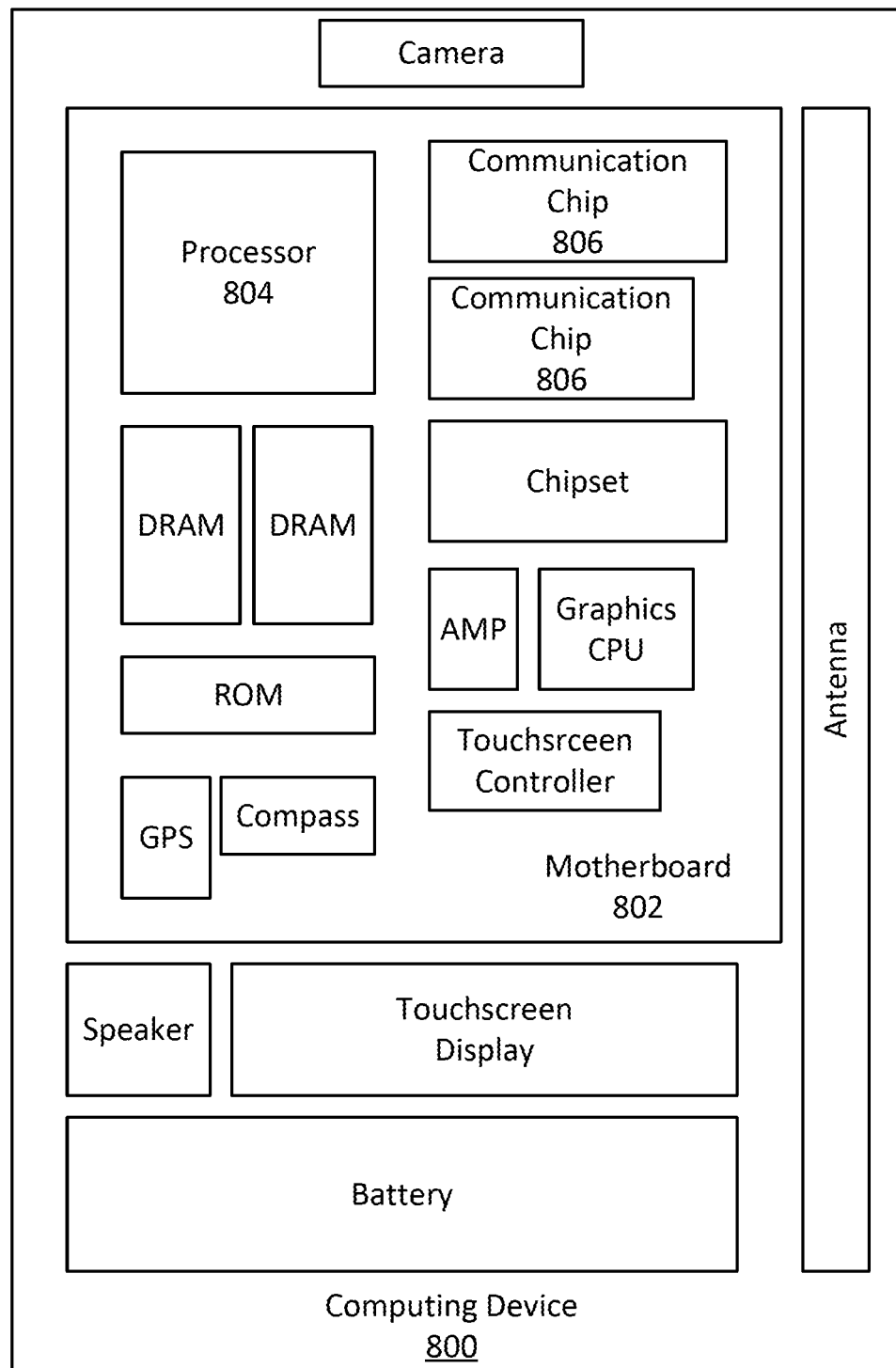
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more 1S-1C or 1S-1C-CBRAM cross-point DRAM arrays, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more embedded 1S-1C-CBRAM cross-point DRAM arrays, in accordance with implementations of embodiments of the disclosure.

In further implementations, another component housed within the computing device 800 may contain an integrated circuit die that includes one or more 1S-1C or 1S-1C-CBRAM cross-point DRAM arrays, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include memory structures having 1S-1C or 1S-1C-CBRAM cross-point DRAM arrays.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A memory device comprises a first selector and a storage capacitor in series with the first selector. A CBRAM is in parallel with the storage capacitor coupled between the first selector and zero volts.

Example embodiment 2: The memory device of example embodiment 1, wherein the storage capacitor is coupled to zero volts.

Example embodiment 3: The memory device of example embodiment 1-2, wherein the selector and the CBRAM are connected via an internal node on the storage capacitor.

Example embodiment 4: The memory device of example embodiment 1-3, wherein the storage capacitor and the CBRAM are coupled to a bit line.

Example embodiment 5: The memory device of example embodiment 1-4 wherein a middle cylinder dielectric layer of the storage capacitor is used as a middle dielectric layer of the CBRAM.

Example embodiment 6: The memory device of example embodiment 5, wherein a "0" state is written to the memory device by applying Vcc on the word line to turn on both the selector and the CBRAM, and turning off Vcc to store 0V in the storage capacitor.

Example embodiment 7: The memory device of example embodiment 5-6, wherein a "1" state is written to the memory device by applying −Vcc on the word line to turn on the selector, and once the CBRAM resets, −V/2 is stored in the storage capacitor.

Example embodiment 8: The memory device of example embodiment 1-7, wherein the memory device comprises a 1S-1C-CBRAM cell.

Example embodiment 9: The memory device of example embodiment 1-8, wherein the memory device comprises an array of 1S-1C-CBRAM cells that form a cross-point DRAM array.

Example embodiment 10: The memory device of example embodiment 1-9, wherein plurality of storage capacitors in the cross-point DRAM array are connected together through respective outer cylinders and tied two zero volts at an edge of the cross-point DRAM array.

Example embodiment 11: A cross-point array comprises a first plurality of conductive lines along a first direction on a substrate. A second plurality of conductive lines is along a second direction on the substrate orthogonal to the first direction. A plurality of individual memory elements located at each cross-section of the first plurality of conductive lines and the second plurality of conductive lines. Each of the memory elements includes a selector, a storage capacitor in series with the selector, and a CBRAM in parallel with the storage capacitor coupled between the selector and zero volts.

Example embodiment 12: The cross-point array of example embodiment 11, wherein the storage capacitor is coupled to zero volts.

Example embodiment 13: The cross-point array of example embodiment 11 or 12, wherein the selector and the CBRAM are connected via an internal node on the storage capacitor.

Example embodiment 14: The cross-point array of example embodiment 11-13, wherein the storage capacitor and the CBRAM are coupled to one of the second plurality of conductive lines, and wherein the second plurality of conductive lines comprises bit lines.

Example embodiment 15: The cross-point array of example embodiment 11-14, wherein the selector is coupled to one of the first plurality of conductive lines, and wherein the first plurality of conductive lines comprises word lines.

Example embodiment 16: The cross-point array of example embodiment 11-15, wherein a "0" state is written to the memory device by applying Vcc on the word line to turn on both the selector and the CBRAM, and turning off Vcc to store 0V in the storage capacitor.

Example embodiment 17: The cross-point array of example embodiment 11-16, wherein a "1" state is written to the memory device by applying −Vcc on the word line to turn on the selector, and once the CBRAM resets, −V/2 is stored in the storage capacitor.

Example embodiment 18: A method of fabricating a 1S-1C-CBRAM cross-point DRAM array comprises forming a first set of conductive lines. Storage capacitors are formed by: forming respective outer cylinder metal layers in the trenches, the respective outer cylinder metal layers conformal to the sidewalls of the trenches and the tops of the conductive lines, patterning a spacer in each of the trenches and performing a unidirectional etch on the outer cylinder metal layers to create openings in the metal layers that expose the conductive lines; forming respective middle cylinder dielectric layers in the trenches conformal to walls of the outer cylinder metal layers; and forming respective inner cylinder internal nodes to fill remaining areas of the trenches. A metal layer is formed over respective storage capacitors, followed by forming access selectors and vias over the metal layer. A second set of conductive lines is formed on the vias.

Example embodiment 19: The cross-point DRAM array of example embodiment 18, further comprising coupling the first plurality of vias to the bit lines and coupling the bypass selectors between the first plurality of vias and the storage capacitors.

Example embodiment 20: The cross-point DRAM array of example embodiment 18-19, further comprising using the middle cylinder dielectric layers of the storage capacitors as a middle dielectric layers of a conductive bridging RAMs (CBRAMs).

Example embodiment 21: The cross-point DRAM array of example embodiment 18-20, further comprising coupling the outer cylinder metal layers of the storage capacitors to the second set of conductive lines, and forming the dielectric layers of the CBRAMS in contact with the second set of conductive lines to place the CBRAMs in parallel with storage capacitors.

Example embodiment 22: The cross-point DRAM array of example embodiment 18-21, further comprising forming the 1S-1C-CBRAM cross-point DRAM array with $4F^2$ or less density.

Example embodiment 23: A memory device comprises a selector and a storage capacitor in series with the selector coupled to zero volts. A triangular pulse is applied to the selector having a rise time and a duration sufficient to cause a displacement current through the capacitor. The displacement current applies a voltage across the selector sufficient to turn on the selector.

Example embodiment 24: The memory device of example embodiment 23, wherein a voltage for the triangular pulse ranges from approximately −0.1V to 2V.

Example embodiment 25: The memory device of example embodiment 23, wherein the duration for the triangular pulse ranges from approximately 200 ps to about 500 ns.

What is claimed is:

1. A transistor-less memory device, comprising:
   a selector;
   a storage capacitor in series with the selector; and
   a conductive bridging RAM (CBRAM) in parallel with the storage capacitor coupled between the selector and zero volts, wherein a middle cylinder dielectric layer of the storage capacitor is used as a middle dielectric layer of the CBRAM.

2. The transistor-less memory device of claim 1, wherein the storage capacitor is coupled to zero volts.

3. The transistor-less memory device of claim 1, wherein the selector and the CBRAM are connected via an internal node on the storage capacitor.

4. The transistor-less memory device of claim 1, wherein the storage capacitor and the CBRAM are coupled to a bit line and the selector is coupled to a word line.

5. The transistor-less memory device of claim 1, wherein a "0" state is written to the memory device by applying Vcc on the word line to turn on both the selector and the CBRAM, and turning off Vcc to store 0V in the storage capacitor.

6. The transistor-less memory device of claim 1, wherein a "1" state is written to the memory device by applying −Vcc on the word line to turn on the selector, and once the CBRAM resets, −V/2 is stored in the storage capacitor.

7. The transistor-less memory device of claim 1, wherein the memory device comprises a 1S-1C-CBRAM cell.

8. The transistor-less memory device of claim 7, wherein the memory device comprises an array of 1S-1C-CBRAM cells that form a cross-point DRAM array.

9. The transistor-less memory device of claim 8, wherein plurality of storage capacitors in the cross-point DRAM array are connected together through respective outer cylinders and tied to zero volts at an edge of the cross-point DRAM array.

10. A transistor-less cross-point array, comprising:
    a first plurality of conductive lines along a first direction on a substrate;
    a second plurality of conductive lines along a second direction on the substrate orthogonal to the first direction;
    a plurality of individual memory elements, a respective one of the plurality of individual memory elements located at each cross-section of the first plurality of conductive lines and the second plurality of conductive lines, ones of the memory elements including:
      a selector;
      a storage capacitor in series with the selector; and
      a conductive bridging RAM (CBRAM) in parallel with the storage capacitor coupled between the selector and zero volts, wherein a middle cylinder dielectric layer of the storage capacitor is used as a middle dielectric layer of the CBRAM.

11. The transistor-less cross-point array of claim 10, wherein the storage capacitor is coupled to zero volts.

12. The transistor-less cross-point array of claim 10, wherein the selector and the CBRAM are connected via an internal node on the storage capacitor.

13. The transistor-less cross-point array of claim 10, wherein the storage capacitor and the CBRAM are coupled to one of the second plurality of conductive lines, and wherein the second plurality of conductive lines comprises bit lines.

14. The transistor-less cross-point array of claim 10, wherein the selector is coupled to one of the first plurality of conductive lines, and wherein the first plurality of conductive lines comprises word lines.

15. The transistor-less cross-point array of claim 10, wherein a "0" state is written to the memory device by applying Vcc on the word line to turn on both the selector and the CBRAM, and turning off Vcc to store 0V in the storage capacitor.

16. The transistor-less cross-point array of claim 10, wherein a "1" state is written to the memory device by applying −Vcc on the word line to turn on the selector, and once the CBRAM resets, −V/2 is stored in the storage capacitor.

* * * * *